(12) United States Patent
Anand et al.

(10) Patent No.: US 8,484,543 B2
(45) Date of Patent: Jul. 9, 2013

(54) FUSEBAY CONTROLLER STRUCTURE, SYSTEM, AND METHOD

(75) Inventors: Darren L. Anand, Williston, VT (US); Kevin W. Gorman, Fairfax, VT (US); Michael R. Ouellette, Westford, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 13/204,929

(22) Filed: Aug. 8, 2011

(65) Prior Publication Data

US 2013/0042166 A1 Feb. 14, 2013

(51) Int. Cl.
*H03M 13/00* (2006.01)

(52) U.S. Cl.
USPC ............................. 714/785; 714/733; 714/718

(58) Field of Classification Search
USPC ................. 714/785, 733, 710, 734, 223, 718, 714/711, 5, 7
See application file for complete search history.

(56) References Cited

U.S. PATENT DOCUMENTS

| | | | |
|---|---|---|---|
| 5,111,457 A | 5/1992 | Rabjohns et al. | |
| 5,134,616 A * | 7/1992 | Barth et al. | 714/711 |
| 5,610,534 A | 3/1997 | Galbraith et al. | |
| 5,732,202 A | 3/1998 | Okamoto | |
| 6,038,179 A | 3/2000 | Eustis et al. | |
| 6,333,878 B2 | 12/2001 | Ooishi | |
| 6,367,042 B1 | 4/2002 | Phan et al. | |
| 6,434,066 B1 | 8/2002 | Waller et al. | |
| 6,577,156 B2 | 6/2003 | Anand et al. | |
| 6,651,202 B1 | 11/2003 | Phan | |
| 6,757,204 B2 | 6/2004 | Di Ronza et al. | |
| 6,766,468 B2 | 7/2004 | Barth, Jr. et al. | |
| 6,768,694 B2 | 7/2004 | Anand et al. | |
| 6,856,569 B2 | 2/2005 | Nelson et al. | |
| 6,898,143 B2 | 5/2005 | Puri et al. | |
| 6,922,649 B2 | 7/2005 | Mondal et al. | |
| 6,961,890 B2 | 11/2005 | Smith | |
| 7,035,158 B2 | 4/2006 | Kozuka | |
| 7,043,672 B2 | 5/2006 | Merritt | |
| 7,085,182 B2 | 8/2006 | Collura et al. | |
| 7,089,136 B2 | 8/2006 | Anand et al. | |
| 7,093,171 B2 * | 8/2006 | Hsu et al. | 714/711 |
| 7,162,669 B2 | 1/2007 | Gross | |
| 7,174,486 B2 | 2/2007 | Adams et al. | |
| 7,218,561 B2 | 5/2007 | Cowles et al. | |
| 7,237,154 B1 | 6/2007 | Zorian | |

(Continued)

OTHER PUBLICATIONS

Agarwal et al., "An Approximation to the Greedy Algorithm for Differential Compression", Jan. 2006, pp. 149-166, IBM J. Res. & Dev., vol. 50, No. 1.

*Primary Examiner* — Fritz Alphonse
(74) *Attorney, Agent, or Firm* — David A. Cain; Hoffman Warnick LLC

(57) ABSTRACT

Error correction is selectively applied to data, such as repair data to be stored in a fusebay for BIST/BISR on an ASIC or other semiconductor device. Duplicate bit correction and error correction code state machines may be included, and selectors, such as multiplexers, may be used to enable one or both types of correction. Each state machine may include an indicator, such as a "sticky bit," that may be activated when its type of correction is encountered. The indicator(s) may be used to develop quality and yield control criteria during manufacturing test of parts including embodiments of the invention.

20 Claims, 4 Drawing Sheets

U.S. PATENT DOCUMENTS

| | | |
|---|---|---|
| 7,251,756 B2 * | 7/2007 | Anand et al. .................. 714/710 |
| 7,269,765 B1 | 9/2007 | Charlton et al. |
| 7,286,419 B2 | 10/2007 | Doi |
| 7,289,382 B2 | 10/2007 | Mozdzen |
| 7,359,243 B2 | 4/2008 | Ha |
| 7,359,261 B1 | 4/2008 | Wu et al. |
| 7,373,573 B2 | 5/2008 | Riley |
| 7,379,357 B2 | 5/2008 | Kang |
| 7,406,620 B2 | 7/2008 | Shubat et al. |
| 7,407,113 B2 * | 8/2008 | Guterman ................... 236/99 K |
| 7,415,640 B1 | 8/2008 | Zorian et al. |
| 7,432,755 B1 | 10/2008 | Park et al. |
| 7,477,565 B2 | 1/2009 | Nam et al. |
| 7,493,541 B1 | 2/2009 | Agrawal et al. |
| 7,512,838 B2 | 3/2009 | Rector et al. |
| 7,538,410 B2 | 5/2009 | Yang |
| 7,551,470 B2 * | 6/2009 | Erickson et al. ................. 365/96 |
| 7,627,792 B2 | 12/2009 | Di Ronza et al. |
| 7,698,608 B2 | 4/2010 | Riley |
| 7,704,805 B1 | 4/2010 | Cheng et al. |
| 7,757,135 B2 | 7/2010 | Nadeau-Dostie et al. |
| 7,774,660 B2 | 8/2010 | Hsu et al. |
| 7,818,490 B2 | 10/2010 | Conley |
| 7,839,707 B2 | 11/2010 | Aakjer |
| 7,895,028 B2 | 2/2011 | Anand et al. |
| 2009/0016129 A1 | 1/2009 | Anand et al. |
| 2009/0190422 A1 | 7/2009 | Khoja et al. |

* cited by examiner

FUSEBAY CONTROLLER STRUCTURE, SYSTEM, AND METHOD

BACKGROUND

The present invention relates to semiconductor devices and, more specifically, to control devices enabling storage of data in a fusebay arrangement.

In semiconductor chip manufacture, self-testing and self-repair systems are often included in a chip design. Such systems typically include a storage device, such as a fusebay, in which repair data may be stored and retrieved by a fusebay controller. The fusebay controller generally processes the repair data during storage and during retrieval, such as by applying compression during storage and decompression during retrieval.

All data stored into a fusebay should be retrievable in a reliable fashion. Typical techniques have focused on the use of digitally programmable sense thresholds to optimize the fuse programming process and to perform margin testing. While these techniques may provide robust fuse programming and sense with current fusebays, these techniques may not be as effective as fuse densities increase. In addition, because fuse sense circuits are increasingly being implemented in silicon-on-insulator (SOI) technologies, the floating body effect contributes to additional sense threshold variation. It is therefore more difficult to perform margin testing with complete assuredness and little impact on manufacturing yield. Further, advanced fuse storage macros include array structures in which many fuses may share a common bitline, which introduces variations in device leakage and data patterns, further contributing to fuse sense uncertainty.

SUMMARY

According to one embodiment of the present invention, a fusebay controller structure may include a retrieval input configured to communicate with a storage data register and a retrieval output configured to communicate with a repair data register. In addition, a storage input may be configured to communicate with the repair data register and a storage output may be configured to communicate with the storage data register. The structure may include duplicate bit (DB) state machine having a retrieval mode, in which the DB state machine is configured to reconstruct a bit of data from every pair of retrieved bits, and a storage mode, in which the DB state machine is configured to generate a duplicate bit of data for each bit of received repair data. In addition, an error correction code (ECC) state machine may be included that may provide a retrieval mode in which the ECC state machine is configured to interpret ECC syndrome bits encountered in retrieved data, and a storage mode in which the ECC state machine is configured to generate ECC syndrome bits for received repair data. The DB and ECC state machines may be selectively enabled with a first DB selector, configured to bypass the DB state machine responsive to a first DB select state and enable the DB state machine responsive to a second DB select state, and a first ECC selector, configured to bypass the ECC state machine responsive to a first ECC select state and enable the ECC state machine responsive to a second ECC select state.

In another embodiment, a fusebay controller system may have a retrieval channel including a retrieval input, a retrieval mode of a duplicate bit (DB) state machine configured to reconstruct a bit of data from every pair of retrieved bits, a retrieval mode of an error correction code (ECC) state machine configured to interpret ECC syndrome bits encountered in retrieved data, and a retrieval output. The retrieval input may be configured to communicate with a storage data register of a storage device, and the retrieval output may be configured to communicate with a repair data register. The system may also include a storage channel including a storage input, a storage mode of the DB state machine configured to generate a duplicate bit of data for each bit of received repair data, a storage mode of the ECC state machine configured to generate ECC syndrome bits for the received repair data, and a storage output. The storage input may be configured to communicate with the repair data register, and the storage output may be configured to communicate with the storage data register. A first DB selector may be configured to bypass the DB state machine responsive to a DB selector signal, and a first ECC selector may be configured to bypass the ECC state machine responsive to an ECC selector signal.

An additional embodiment of the invention may include a fusebay control method executed by a fusebay controller structure that may include a duplicate bit (DB) state machine, an error correction code (ECC) state machine, a DB selector, an ECC selector, a storage input configured to be connected to a repair data register, a storage output configured to be connected to a storage data register of a storage device, a retrieval input configured to be connected to the storage data register, and a retrieval output configured to be connected to a repair data register. One of a retrieval mode or a storage mode may be selected, and it may be determined whether to use at least one of DB correction or ECC correction. Responsive to DB correction being used, the DB selector may be controlled so that the DB state machine is employed, and responsive to ECC correction being used, the ECC selector may be controlled so that the ECC state machine is employed. Responsive to the retrieval mode, data may be received from the retrieval input, and the data may be processed responsive to at least one of the DB or ECC state machines being selected. The data may then be sent to the retrieval output. Responsive to the storage mode, data may be received from the storage input, and the data may be processed responsive to at least one of the DB or ECC state machines being selected. The data may then be sent to the storage output.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments of the invention disclosed herein provide a fusebay controller system that may offer flexibility at manufacturing test and that may employ various levels of data integrity uplift. Such flexibility and data integrity uplift may advantageously improve fuse programming yield with relatively little impact on test escapes of marginally programmed fuses.

Figure 1:
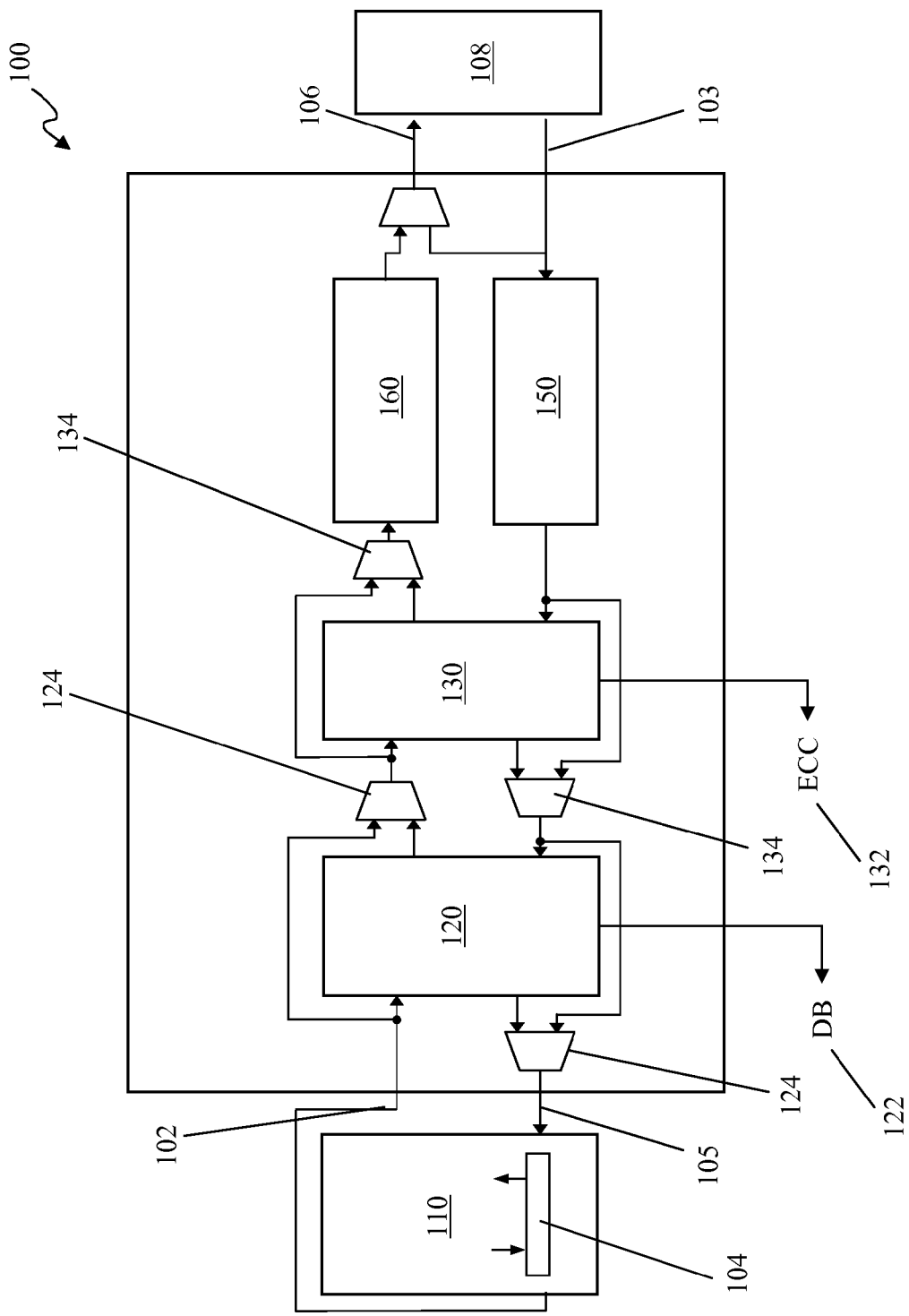
FIG. 1 is a schematic diagram of a fusebay controller according to an embodiment of the invention disclosed herein.

As seen in FIG. 1, embodiments of the invention disclosed herein may include a fusebay controller structure or system 100 that offers flexibility at manufacturing test, to employ various levels of data integrity uplift. This flexibility is desirable in order to provide a means of optimizing fuse programming yield without overly impacting test escapes of marginally programmed fuses.

Embodiments of fusebay controller structure 100 may include a retrieval input 102 configured to communicate with a storage data register 104, such as may be included in a fusebay or other storage device, and a retrieval output 106 configured to communicate with a repair data register 108. The retrieval input 102 may be used to retrieve data stored on a storage device 110 via storage data register 104. The retrieved data may then be processed in fusebay controller structure 100 and sent to repair data register 108 via retrieval output 106.

In addition, fusebay controller structure 100 may include a storage input 103 configured to communicate with the repair data register 108 and a storage output 105 configured to communicate with the storage data register 104. The storage input 103 may be used to receive data from an external source, such as repair register 108. The received data may then be processed in fusebay controller structure 100 and sent to storage data register 104 via storage output 105.

In embodiments of the invention disclosed herein, fusebay controller structure 100 may process data with various components, as suggested above. For example, fusebay controller structure 100 may include a duplicate bit (DB) state machine 120 selectively operable in a retrieval mode and a storage mode. In retrieval mode, DB state machine 120 may process every two bits of data retrieved into one bit of usable data. In storage mode, DB state machine 120 may be configured to perform DB encoding of received repair data before it is sent to storage output 105, which, in embodiments, may be connected to storage device 110 via storage data register 104. DB state machine 120 may be configured to send a DB correction signal 122 when a DB correction has been detected in received stored data. For example, DB correction signal 122 may be a DB correction indicator "sticky bit" that may be read by an external device, such as a tester during manufacture and test. DB correction signal 122 may thus be used as a criterion for operations during manufacturing test. For example, DB correction signal 122 could be used to determine a number of parts that use DB correction during retrieval and/or a percentage of a part's data that receives DB correction, which could then be used to determine whether parts should be discarded or shipped.

An additional example of a data processing component that might be used in fusebay controller structure 100 is an error correction code (ECC) state machine 130, also having a retrieval mode and a storage mode. In retrieval mode, ECC state machine 130 may be configured to detect ECC syndrome bits in retrieved data and/or to perform ECC correction on retrieved data. In storage mode, ECC state machine 130 may be configured to generate ECC syndrome bits in received repair data before it is sent to storage output 105, which, in embodiments, may be connected to storage device 110 via storage data register 104. ECC state machine 130 may also be configured to send an ECC correction signal 132 when an ECC correction has been detected in received stored data. For example, ECC correction signal 132 may be an ECC correction indicator "sticky bit" that may be read by an external device, such as a tester during manufacturing test. ECC correction signal 132 may thus be used as a criterion for operations during manufacture. For example, ECC correction signal 132 could be used to determine a number of parts that use ECC correction during retrieval and/or what percentage of a given part's data receives ECC correction, which could then be used to determine whether parts should be discarded or shipped.

It may be advantageous to employ compression on data to be stored so that fewer bits are required to store the information represented by the data. Accordingly, embodiments may employ a compressor 150 between storage input 103 and any other components of fusebay controller 100. Where a DB state machine 120 and/or an ECC state machine 130 are included, DB encoding and/or ECC encoding could be performed on compressed data. Further, embodiments including a compressor 150 may also include a decompressor 160 between retrieval output 106 and components of fusebay controller 100 other than compressor 150. In such embodiments, decompressor 160 may restore retrieved data to a usable form before passing it to retrieval output 106.

Together, retrieval input 102, retrieval portions of DB state machine 120 and ECC state machine 130, decompressor 160, and retrieval output 106 may be viewed as a retrieval channel of fusebay controller structure 100. Similarly, storage input 103, compressor 150, storage portions of ECC state machine 130 and DB state machine 120, and storage output 105 may be viewed as a storage channel of fusebay controller structure 100. In embodiments, some components may be shared for operations in either direction, depending on whether retrieval or storage is performed.

To allow selective use of DB state machine 120, embodiments of the invention disclosed herein may employ a DB selector 124. DB selector 124 may occupy a first state in which DB state machine 120 is bypassed and a second state in which DB state machine 120 is employed. Thus, when DB selector 124 occupies the first state, DB correction is not employed, while when DB selector 124 occupies the second state, DB correction is employed. In this manner, DB selector 124 may be used to enable or disable DB correction during data retrieval and/or DB encoding during data storage by fusebay controller structure 100. It should be noted that, while DB selector 124 is shown using two separate objects in FIG. 2, this is not necessarily the form DB selector 124 might take. DB selector 124 may be a single device, such as a multiplexer or MUX, or multiple devices as appropriate and/or desired for a given embodiment. For example, a retrieval DB selector could be used for data retrieval and a storage DB selector could be used for data storage.

Similarly, to allow selective use of ECC state machine 130, an ECC selector 134 may be included in embodiments. ECC selector 134 may occupy a first state in which ECC state machine is bypassed and a second state in which ECC state machine 130 is enable. Thus, in response to ECC selector 134 occupying the first state, ECC correction is not employed, while in response to ECC selector 134 occupying the second state, ECC correction is employed. In this manner, ECC selector 134 may be used to enable or disable ECC correction during data retrieval and/or ECC encoding during storage of data with fusebay controller structure 100. During storage, ECC selector 134 and/or DB selector 124 may be responsive to a control signal, such as a control signal from a tester device to which fusebay controller structure 100 may be connected. During retrieval mode in embodiments, however, ECC selector 134 and/or DB selector 124 may be responsive to portions of retrieved data interpreted as indicating that ECC correction must be applied and/or DB correction must be applied. It should be noted that, as with DB selector 124, above, while ECC selector 134 is shown using two separate objects in FIG. 2, this is not necessarily the form that ECC selector 134 might take. ECC selector 134 may be a single device, such as a multiplexer or MUX, or multiple devices as desired and/or appropriate for a given embodiment. For example, a retrieval ECC selector could be used for data retrieval and a storage ECC selector could be used for data storage.

In embodiments including DB state machine 120, ECC state machine 130, compressor 150, and decompressor 160, four modes of operation may be achieved with DB selector 124 and ECC selector 134. These four modes are shown in Table 1, below, where DB_SEL represents the state of DB selector 120 and ECC_SEL represents the state of ECC selector 130. A zero in Table 1 represents the first state of the respective selector, while a one represents the second state of the respective selector. It should be noted that, while including compressor 150 and decompressor 160 may be advantageous, they are not necessarily required.

As seen in Table 1, a first mode in which no data correction protection is employed may be achieved by placing both DB selector 124 and ECC selector 134 in their respective first states. In this first mode, data is still compressed, but DB state machine 120 and ECC state machine 130 are bypassed. The compressed repair data is simply stored/retrieved into/from storage device 110 using one storage bit, such as a fuse of a fusebay, per bit of stored data.

TABLE 1

| DB_SEL | ECC_SEL | Result |
|---|---|---|
| 0 | 0 | no protection |
| 0 | 1 | ECC correction only |
| 1 | 0 | DB (duplicate-bit) correction only store compressed repair data using two fuses per bit of stored data |
| 1 | 1 | ECC and DB correction generate ECC syndrome bits for segments of data stored along with raw data during compression/storage, generated ECC syndrome bits, along with the compressed repair data bits, and use two fuse bits to store each bit of resultant data, such data being stored into fuses and during fuse sense/decompression, data is retrieved from fuses and each pair of data bits are DB reduced to a single bit of data, and ECC correction is implemented prior to entering decompressor. |

A second mode of fusebay controller structure 100 may be achieved by placing DB selector 124 in its first state while placing ECC selector 134 in its second state. DB state machine 120 is therefore bypassed, while ECC state machine 130 is enabled for application of ECC encoding and correction. During compression/storage, ECC state machine 120 may generate ECC syndrome bits, which are stored with the compressed repair data bits, one fuse per bit of stored data. During retrieval/decompression, any ECC syndrome bits are retrieved from storage device 110 along with compressed data bits, and ECC correction may be applied before the retrieved ECC syndrome bits and the retrieved compressed data bits are passed to decompressor 160.

A third mode of fusebay controller structure 100 may be achieved by placing DB selector 120 in its second mode while placing ECC selector 130 in its first mode. DB state machine 120 is thus employed while ECC state machine 130 is bypassed. During data storage, no ECC syndrome bits are generated so that only compressed data is processed with DB state machine 120, resulting in two storage bits being used for each bit of compressed data to be stored. Conversely, during data retrieval, no ECC syndrome bits are retrieved so that every two bits of retrieved data are processed into one bit of stored compressed data.

A fourth mode of fusebay controller structure may be achieved by placing both DB selector 124 and ECC selector 134 in their respective second states. Both DB state machine 120 and ECC state machine 130 would thus be employed during data handling. During retrieval, two storage bits would be read for each bit of stored data, including any ECC syndrome bits and compressed data, with ECC correction being implemented prior to decompression of the data. During storage, ECC syndrome bits generated by ECC state machine 130 are stored with compressed data using two bits per bit sent to storage output 105, thence to any connected storage device 110.

In operation, a determination of which mode to employ in fusebay controller structure 100 may take into account how much each mode adds to storage requirements for a given amount of data. For example, considering 63 bits of data, the first mode will require 63 storage bits, while the second mode would require 72 storage bits, the third mode would require 126 storage bits, and the fourth mode would require 144 bits of storage. Thus, during design of a chip with which embodiments of the invention might be used, on-chip storage should be designed to accommodate the storage requirements resulting from the mode(s) that may be employed for storage of data.

Fusebay controller structure 100 may be construed as a fusebay controller system when connected to a storage device 110, such as a fusebay. Such a fusebay controller system may also include repair register 108 and other devices involved in the control and/or processing of data handled by fusebay controller structure 100. Additionally, while fusebay controller structure 100 has been described as a circuit, other implementations are within the scope of embodiments.

Figure 2:
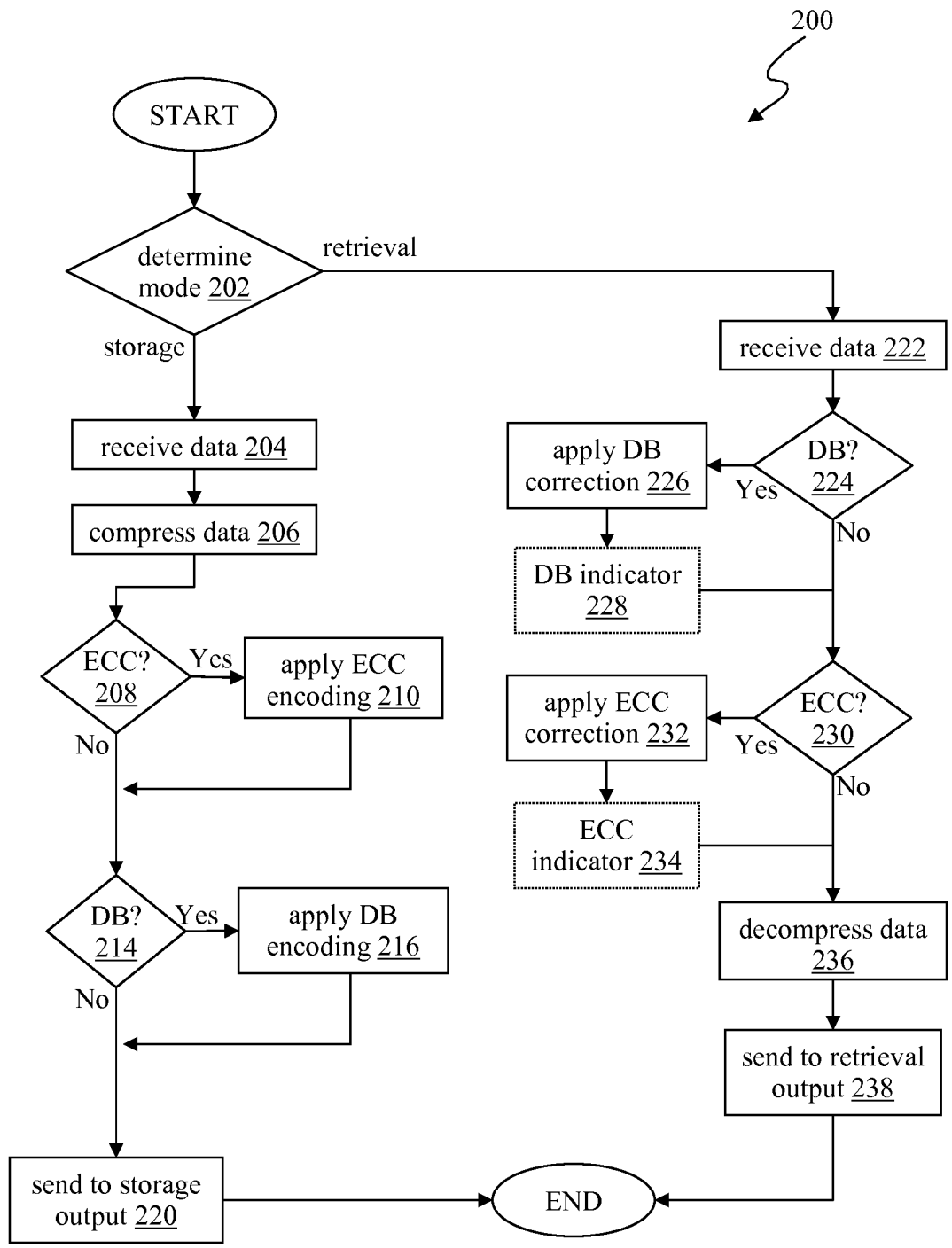
FIG. 2 is a schematic flow diagram of a fusebay control method according to another embodiment of the invention disclosed herein.

With reference to FIG. 2, a fusebay control method 200 includes determining what mode in which to operate (decision block 202). If the mode is programming or storage mode, then data may be received via storage input 103, such as from repair register 108 (block 204). Where a compressor 150 is included, data may be compressed (block 206). A check may be made to see whether ECC encoding is selected (decision block 208), and ECC encoding may be applied if ECC encoding is selected (block 210). When ECC encoding is not selected (as determined at decision block 208) or after ECC encoding has been applied (block 210), a check may be made to determine whether DB encoding is selected (decision block 214). If DB encoding is selected (decision block 214), DB encoding may be applied (block 216). Where DB correction was not selected (decision block 214) or after DB encoding has been applied (block 216), the resulting compressed and/or processed and/or encoded data is sent to storage output 105 (block 220) and the method ends.

If it is determined that retrieval mode is to be employed (block 202), then data may be received (block 222), such as from retrieval input 102 connected to a storage device, and a check is made to determine whether DB correction should be employed (decision block 224). If DB correction is selected (decision block 224), DB correction may be applied (block 226), and, if a DB correction is made, a DB indicator or signal may be activated (block 228). Where DB correction is not selected (decision block 224) or after application of DB correction (block 226), a check may be made to determine whether ECC correction is selected (decision block 230). If ECC correction is selected (decision block 230), ECC correction may be applied (block 232), and, if an ECC correction is made, an ECC indicator or signal may be activated (block 234). If ECC correction is not selected (decision block 230) or after ECC correction has been applied (block 232), the retrieved and/or processed and/or correction data may be decompressed (block 236) and sent to retrieval output 106 (block 238), and the method ends.

Figure 3:
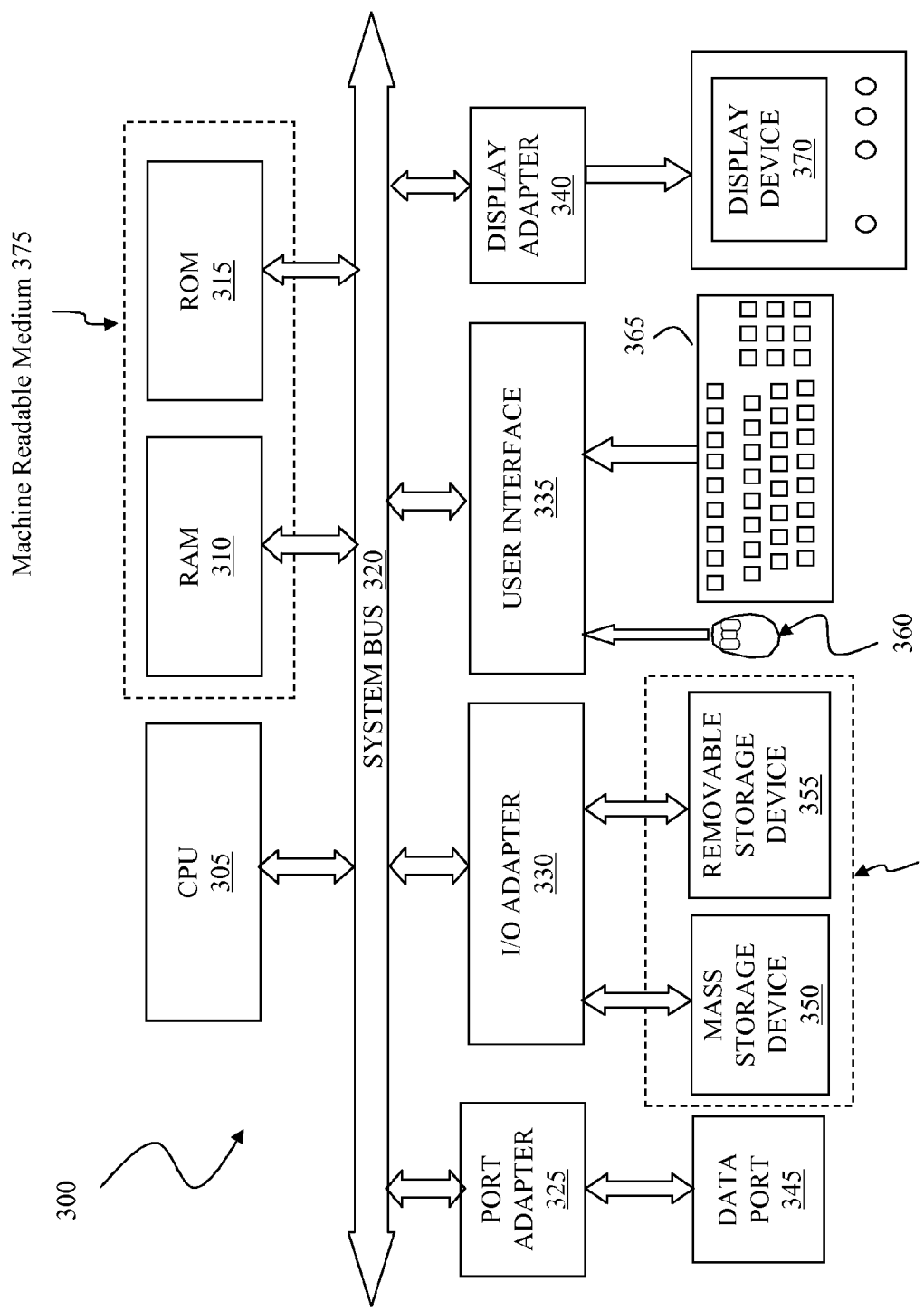
FIG. 3 is a block diagram of a general purpose computer system which may be used to practice the invention.

FIG. 3 illustrates a block diagram of a general-purpose computer system which can be used to implement the fusebay controller circuit and circuit design structure described herein. The design structure may be coded as a set of instructions on removable or hard media for use by general-purpose computer. FIG. 3 is a schematic block diagram of a general-purpose computer for practicing the present invention. FIG. 3 shows a computer system 300, which has at least one microprocessor or central processing unit (CPU) 305. CPU 305 is interconnected via a system bus 320 to machine readable media 375, which includes, for example, a random access memory (RAM) 310, a read-only memory (ROM) 315, a removable and/or program storage device 355 and a mass data and/or program storage device 350. An input/output (I/O) adapter 330 connects mass storage device 350 and removable storage device 355 to system bus 320. A user interface 335 connects a keyboard 365 and a mouse 360 to system bus 320, and a port adapter 325 connects a data port 345 to system bus 320 and a display adapter 340 connect a display device 370. ROM 315 contains the basic operating system for computer system 300. Examples of removable data and/or program storage device 355 include magnetic media such as floppy drives, tape drives, portable flash drives, zip drives, and optical media such as CD ROM or DVD drives. Examples of mass data and/or program storage device 350 include hard disk drives and non-volatile memory such as flash memory. In addition to keyboard 365 and mouse 360, other user input devices such as trackballs, writing tablets, pressure pads, microphones, light pens and position-sensing screen displays may be connected to user interface 335. Examples of display device 370 include cathode-ray tubes (CRT) and liquid crystal displays (LCD).

A machine readable computer program may be created by one of skill in the art and stored in computer system 300 or a data and/or any one or more of machine readable medium 375 to simplify the practicing of this invention. In operation, information for the computer program created to run the present invention is loaded on the appropriate removable data and/or program storage device 355, fed through data port 345 or entered using keyboard 365. A user controls the program by manipulating functions performed by the computer program and providing other data inputs via any of the above mentioned data input means. Display device 370 provides a means for the user to accurately control the computer program and perform the desired tasks described herein.

Figure 4:
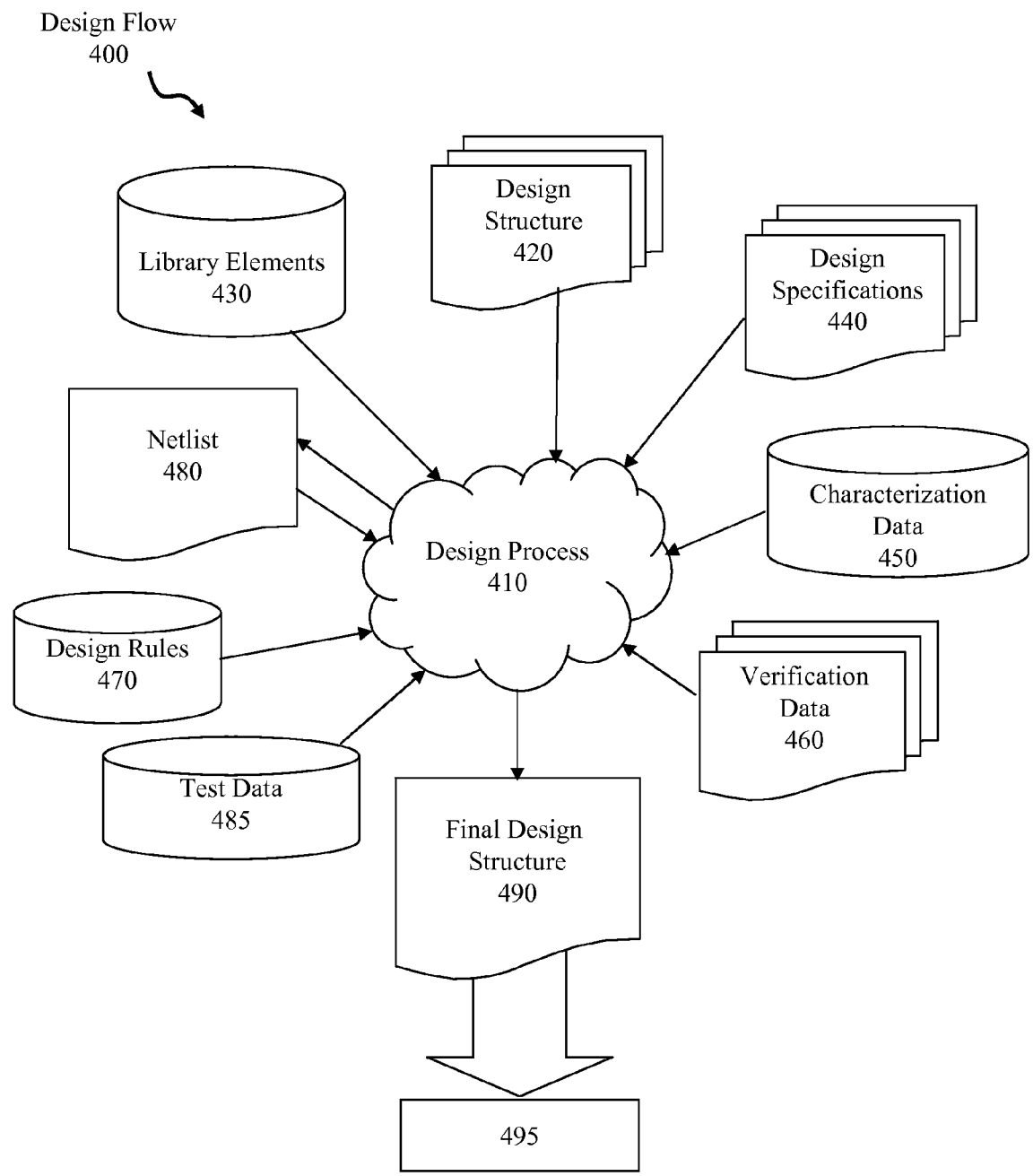
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 comprises circuit or fusebay controller structure 100 in the form of schematics or HDL, a hardware-description language (e.g., Verilog, VHDL, C, etc.). Design structure 420 may be contained on one or more machine readable medium. For example, design structure 420 may be a text file or a graphical representation of circuit or fusebay controller structure 100. Design process 410 preferably synthesizes (or translates) circuit or fusebay controller structure 100 into a netlist 480, where netlist 480 is, for example, a list of wires, transistors, logic gates, control circuits, I/O, models, etc., that describes the connections to other elements and circuits in an integrated circuit design and recorded on at least one of machine readable medium. This may be an iterative process in which netlist 480 is resynthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 40 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the invention. The design structure of the invention is not limited to any specific design flow.

Ultimately, design process 410 preferably translates circuit or fusebay controller structure 100, along with the rest of the integrated circuit design (if applicable), into a final design structure 490 (e.g., information stored in a GDS storage medium). Final design structure 490 may comprise information such as, for example, test data files, design content files, manufacturing data, layout parameters, wires, levels of metal, vias, shapes, test data, data for routing through the manufacturing line, and any other data required by a semiconductor manufacturer to produce circuit or fusebay controller structure 100. Final design structure 480 may then proceed to a stage 485 where, for example, final design structure 480 proceeds to tape-out, is released to manufacturing, is sent to another design house or is sent back to the customer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A fusebay controller structure comprising:
a retrieval input configured to communicate with a storage data register;
a retrieval output configured to communicate with a repair data register;
a storage input configured to communicate with the repair data register;
a storage output configured to communicate with the storage data register;
a duplicate bit (DB) state machine having a retrieval mode in which the DB state machine is configured to reconstruct a bit of data from every pair of retrieved bits, and a storage mode in which the DB state machine is configured to generate a duplicate bit of data for each bit of received repair data;
an error correction code (ECC) state machine having a retrieval mode in which the ECC state machine is configured to interpret ECC syndrome bits encountered in retrieved data, and a storage mode in which the ECC state machine is configured to generate ECC syndrome bits for received repair data;
a first DB selector configured to bypass the DB state machine responsive to a first DB select state and to enable the DB state machine responsive to a second DB select state; and
a first ECC selector configured to bypass the ECC state machine responsive to a first ECC select state and to enable the ECC state machine responsive to a second ECC select state.

2. The fusebay controller structure of claim 1, further comprising a compressor connected to the storage input and a decompressor connected to the retrieval output.

3. The fusebay controller structure of claim 1, wherein the DB state machine is further configured to send a DB correction signal when DB correction is encountered.

4. The fusebay controller structure of claim 1, wherein the ECC state machine is further configured to send an ECC correction signal when an ECC correction is at least one of encountered or performed.

5. The fusebay controller structure of claim 1, wherein, in response to the first DB selector being in the first DB select state and the first ECC selector being in the first ECC select state, data from the retrieval input bypasses both the ECC and DB state machines.

6. The fusebay controller structure of claim 1, wherein, in response to the first DB selector being in the first DB select state and the first ECC selector being in the second ECC select state, data from the retrieval input bypasses the DB state machine, and the ECC state machine is enabled.

7. The fusebay controller structure of claim 1, wherein, in response to the first DB selector being in the second DB select state and the first ECC selector being in the first ECC select state, data from the retrieval input bypasses the ECC state machine, and the DB state machine is enabled.

8. The fusebay controller structure of claim 1, wherein, in response to the first DB selector being in the second DB select state and the first ECC selector being in the second ECC select state, data from the retrieval input passes through both the DB state machine and the ECC state machine, the ECC state machine is enabled, and the DB state machine is enabled.

9. The fusebay controller structure of claim 1, wherein, in response to the retrieval mode, the state in which the first DB selector and the first ECC selector are placed is determined by a portion of the retrieved data.

10. The fusebay controller structure of claim 1, wherein, in response to the storage mode, the state in which the first DB selector and the first ECC selector are placed is determined by respective first DB selector and first ECC selector signals received by the fusebay controller structure.

11. The fusebay controller structure of claim 1, wherein, in retrieval mode, the ECC state machine implements an ECC correction responsive to ECC syndrome bits encountered in retrieved data.

12. The fusebay controller structure of claim 1, wherein the first DB selector and the first ECC selector are effective in response to the retrieval mode and further comprising a second DB selector and a second ECC selector that are effective in response to the storage mode, the second DB selector bypassing the DB state machine in the first DB select state and enabling the DB state machine in the second DB select state, and the second ECC selector bypassing the ECC state machine in the first ECC select state and enabling the first ECC select state machine in the second ECC select state.

13. A fusebay controller system comprising:
a retrieval channel including:
a retrieval input configured to communicate with a storage data register of a storage device;
a retrieval mode of a duplicate bit (DB) state machine configured to reconstruct a bit of data from every pair of retrieved bits;
a retrieval mode of an error correction code (ECC) state machine configured to interpret ECC syndrome bits encountered in retrieved data; and
a retrieval output configured to communicate with a repair data register;
a storage channel including:
a storage input configured to communicate with the repair data register;
a storage mode of the DB state machine configured to generate a duplicate bit of data for each bit of received repair data;
a storage mode of the ECC state machine configured to perform an ECC encode; and
a storage output configured to communicate with the storage data register;
a first DB selector configured to bypass the DB state machine responsive to a DB selector signal; and
a first ECC selector configured to bypass the ECC state machine responsive to an ECC selector signal.

14. The fusebay controller system of claim 13, wherein the storage channel further includes a compressor and the retrieval channel further includes a decompressor.

15. The fusebay controller system of claim 13, wherein the state assumed by the DB selector signal and the ECC selector signal is determined based on a portion of retrieved data.

16. The fusebay controller system of claim 13, wherein at least one of the DB state machine and the ECC state machine is configured to generate a respective signal in response to a respective type of correction being encountered.

17. A fusebay control method executed by a fusebay controller structure including a duplicate bit (DB) state machine, an error correction code (ECC) state machine, a DB selector, an ECC selector, a storage input configured to be connected to a repair data register, a storage output configured to be connected to a storage device, a retrieval input configured to be connected to the storage device, and a retrieval output configured to be connected to the repair data register, the method comprising:
selecting one of a retrieval mode or a storage mode;

determining whether to use at least one of DB correction or ECC correction;

responsive to the DB correction being used, controlling the DB selector so the DB state machine is employed;

responsive to the ECC correction being used, controlling the ECC selector so the ECC state machine is employed;

responsive to the retrieval mode, receiving data from the retrieval input, processing the data responsive to at least one of the DB or ECC state machines being selected, and sending the data to the retrieval output; and responsive to the storage mode, receiving data from the storage input, processing the data responsive to at least one of the DB or ECC state machines being selected, and sending the data to the storage output.

18. The fusebay control method of claim 17, wherein the fusebay controller structure further comprises a compressor between the storage input and the storage output and a decompressor between the retrieval input and the retrieval output, and the method further comprises compressing the data with the compressor in the storage mode, and decompressing the data with the decompressor in the retrieval mode.

19. The fusebay control method of claim 17, wherein the determining of whether to use at least one of the DB state machine or the ECC state machine is made in accordance with a desired manufacturing yield.

20. The fusebay control method of claim 17, wherein the determining of whether to use at least one of the DB state machine or the ECC state machine is made in accordance with a desired field failure rate.

* * * * *